United States Patent
Huber et al.

(10) Patent No.: US 7,183,855 B2
(45) Date of Patent: Feb. 27, 2007

(54) CIRCUIT ARRANGEMENT FOR THE SWITCHABLE AMPLIFICATION OF VARIABLE ELECTRICAL SIGNALS

(75) Inventors: Klaus Huber, Röttenbach (DE); Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 316 days.

(21) Appl. No.: 10/959,303

(22) Filed: Oct. 7, 2004

(65) Prior Publication Data

US 2005/0104655 A1    May 19, 2005

(30) Foreign Application Priority Data

Oct. 10, 2003   (DE) ................. 103 47 833
Sep. 15, 2004   (DE) .............. 10 2004 044 741

(51) Int. Cl.
*H03F 3/68*   (2006.01)

(52) U.S. Cl. ................. 330/295; 330/124 R; 330/278

(58) Field of Classification Search ................ 330/295, 330/124 R, 124 D, 278

See application file for complete search history.

(56) References Cited

U.S. PATENT DOCUMENTS 5,486,791 A    1/1996  Spitalny et al.

2003/0124999 A1    7/2003  Parssinen et al.

FOREIGN PATENT DOCUMENTS

EP    0 797 873 B1    1/1997

OTHER PUBLICATIONS

German Search Report mailed Jun. 23, 2006.

*Primary Examiner*—Michael B Shingleton
(74) *Attorney, Agent, or Firm*—Staas & Halsey LLP

(57) ABSTRACT

Circuit arrangement for the switchable amplification of variable electrical signals having at least one signal input and a signal output. A switchable amplifier is present between signal input and signal output and is provided with an input, with an output and with a negative feedback path having at least one resistor between input and output. The circuit arrangement further comprises a voltage source, the polarity of which can be reversed by a switching element. In this case, the negative feedback path has a switchable bypass connected in parallel with the at least one resistor. The signals fed in at the amplifier input are furthermore to be fed to the amplifier output in amplified fashion via a first signal path or in unamplified fashion via a second signal path depending on the polarity of the voltage source.

30 Claims, 4 Drawing Sheets

CIRCUIT ARRANGEMENT FOR THE SWITCHABLE AMPLIFICATION OF VARIABLE ELECTRICAL SIGNALS

CROSS REFERENCE TO RELATED APPLICATIONS

This application is based on and hereby claims priority to German Application No. 10347833.7 filed on Oct. 10, 2003 and German Application No. 10 2004 044 741.1 filed on Sep. 15, 2004, the contents of which are hereby incorporated by reference.

BACKGROUND OF THE INVENTION

The invention relates to a circuit arrangement for the switchable amplification of variable electrical signals.

In the case of an ensemble of variable electrical signals, in particular of RF (radiofrequency) signals, with levels of different magnitudes, it is advantageous to match them at least in stages to approximately the same maximum level magnitude. Thus, by way of example, a downstream AD converter can always be driven optimally and the signal/noise ratio, called S/N ratio hereinafter, can be maximized. This generally requires an amplifier that is looped into the signal flow only as required, to be precise at correspondingly low levels. At correspondingly high signal levels, by contrast, the signal is passed through as far as possible without any attenuation, the original S/N ratio being maintained.

It is conceivable to permit a very low-noise amplifier to be permanently looped in and to insert a switchable attenuation element into the output path of the amplifier, which attenuation element attenuates the preceding gain again in the case of high levels. In this case, however, the S/N ratio deteriorates by the noise figure of the amplifier, which may be very small, however, with a value of 1 dB. The problem in this case, however, is that the amplifier must be configured in such a way that it can supply to the attenuation element an output level which exceeds the maximum possible input level by its gain. In order to obtain the signal precisely thus with little distortion, this requires a very high outlay on circuitry for the amplifier, which simultaneously requires a high DC power. A high DC power consequently leads to high heating of the amplifier, so that a waste heat problem additionally occurs in this case.

The opposite arrangement, connecting the switchable attenuation element upstream of the amplifier, is ruled out from the outset owing to the drastic deterioration of the S/N ratio.

A known standard configuration for solving the problem is an amplifier 28 with a switchable bypass 10 arranged outside the amplifier 28 in accordance with FIG. 1. In this case, the amplifier 28 shown is connected to the voltage source 9 via two supply terminals 15 and 16. In accordance with the represented switch position of the switching element 8, a supply voltage is thus present at the amplifier 28. By way of example, if the voltage source supplies a DC voltage of 5 V, then +5 V is applied to the first supply terminal 15, while 0 V is applied to the second supply terminal 16. The amplifier 28 is consequently activated. Furthermore, a circuit element S1 and S2 is respectively arranged between signal input 1 and amplifier input 3 and between amplifier output 4 and signal output 2. In this case, the two circuit elements S1 and S2 are electrically coupled to one another. In accordance with the represented switch position of the circuit element 8, +5 V, for example, is likewise applied to the control inputs 25, so that the two switching elements S1 and S2 are present in a manner coupled to one another in the switch positions represented. A signal fed in at the signal input 1 thus passes via the amplifier 28 to the signal output 2. In the case of the second switch position (not represented) of the switching element 8, no voltage is present at the two control inputs 24. The signal fed in at the signal input 1 consequently passes to signal output 2 in unamplified fashion via the switchable bypass 10. Since, in the case of this switch position, no supply voltage is present at the amplifier 28 either, the latter is deactivated.

One problem of this arrangement with the amplifier activated is the finite blocking attenuation of the switches brought about by the capacitive residual coupling. It should be at least as high as the gain. Otherwise there is the risk of self-excitation depending on amplifier type and phase rotation in the bypass branch. Owing to the capacitive nature of the residual coupling, the problem is aggravated toward high frequencies and, if appropriate, necessitates very complicated switch structures. Even if the blocking attenuation is not sufficiently higher than the gain, however, the finite negative feedback or feedback dependent on frequency or phase angle causes a frequency-dependent change in the gain.

SUMMARY OF THE INVENTION

It is one possible object of the present invention to specify a circuit arrangement for the switchable amplification of variable electrical signals which can to the greatest possible extent overcome the problem discussed above.

The inventors propose a circuit arrangement for the switchable amplification of variable electrical signals having at least:
- a signal input and a signal output,
- an amplifier, which is present between signal input and signal output and is provided with an input, with an output and with a negative feedback path having at least one resistor between input and output, and
- a voltage source, the polarity of which can be reversed by a switching element, is intended to be configured to the effect that
- the negative feedback path has a switchable bypass connected in parallel with the at least one resistor, and
- the signals fed in at the amplifier input are to be fed to the amplifier output in amplified fashion via a first signal path or in unamplified fashion via a second signal path, depending on the polarity of the voltage source.

By virtue of the fact that the switchable bypass is placed into the negative feedback path of the amplifier and the amplifier is configured such that it performs a part of the switching function in a manner dependent on its supply voltage, the associated advantages are to be seen in particular in unburdening the signal path between signal input and signal output of undesirable bypasses toward ground.

Thus, it is possible that in a manner dependent on the polarity of the voltage source, the switchable amplifier is to be activated and the switchable bypass is to be deactivated or the switchable amplifier is to be deactivated and the switchable bypass is to be activated. What is thus achieved is, on the one hand, that the synchronous interaction of the switchable amplifier and the switchable bypass is ensured in the circuit arrangement and, on the other hand, a simplification of the circuit arrangement by virtue of the fact that both can be connected to the same voltage supply.

Preferably, the switchable amplifier may comprise a first and a second transistor and each of the two transistors may be embodied with a collector, an emitter and a base. In this case, the two collectors are connected to the amplifier output. Furthermore, the emitter of the first transistor is connected to the voltage source via a first supply terminal and the emitter of the second transistor is connected to the voltage source via a second supply terminal. Such an interconnection of two transistors yields an amplifier arrangement that is simple to realize and operates sufficiently rapidly and effectively for this intended use.

In this case, it is advantageous that the first transistor is a pnp transistor and the second transistor is an npn transistor. This complementary embodiment means that the amplifier has a high modulation range.

Preferably, the base of the first transistor is connected to the first supply terminal via at least one first diode comprising a cathode and an anode and at least one resistor and the base of the second transistor is connected to the second supply terminal via at least one second diode comprising a cathode and an anode and at least one resistor. In this case the cathode of the at least one first diode is connected to the base of the first transistor and the anode of the at least one second diode is connected to the base of the second transistor. The diodes and resistors connected in this way serve to advantageously define the quiescent current for the transistors.

Moreover, it is advantageous that the base of the first transistor is connected to the amplifier input via a first parallel circuit comprising at least one capacitance and at least one resistor and the base of the second transistor is connected to the amplifier input via a second parallel circuit comprising at least one capacitance and at least one resistor. This ensures that the signals fed in at the signal input pass to the base electrodes via the capacitors. Moreover, the resistors thus arranged between the diodes fulfil the function of a voltage divider for defining the quiescent operating potentials.

In particular, at least two resistors are in each case arranged between an emitter and a supply terminal. In this case, a node is in each case provided between the at least two resistors, the node being connected to a respective reference potential in each case via at least one capacitance.

Preferably, the first signal path arranged between amplifier input and amplifier output is subdivided into two symmetrical partial paths. In this case, the first partial path comprises the capacitance of the first parallel circuit and the first transistor and the second partial path comprises the capacitance of the second parallel circuit and the second transistor. Moreover, the second signal path arranged between amplifier input and amplifier output has the switchable bypass.

It is advantageous that the switchable bypass is a diode bridge having four diodes, each diode being provided with an anode and a cathode. In this case, a first terminal of the diode bridge is connected to the first supply terminal via at least one first series resistor and a second terminal of the diode bridge is connected to the second supply terminal via at least one second series resistor. Depending on the polarity of the voltage present, the diode bridge blocks the signal path or loops the signals further to the amplifier output. In this case, the series resistors serve for limiting the diode current along the diode bridge.

In this case, in an advantageous manner, the first terminal is connected to two cathodes of the diode bridge and the second terminal is connected to two anodes of the diode bridge. It is ensured in this case that the diode bridge effects blocking if the amplifier is activated, and loops the signal through if the amplifier is deactivated.

It is furthermore advantageous in this case that at least one first inductance is arranged between the first terminal of the diode bridge and the at least one first series resistor and at least one second inductance is arranged between the second terminal of the diode bridge and the at least one second series resistor. In this case, the inductances serve for preventing the loading of the signal via the series resistors.

Furthermore, the diode bridge is advantageously formed from pin diodes. In particular, in the case of radio frequency signals, it is thus possible to achieve a low insertion loss, lying in the slightly above zero dB, with little forward current.

However, it is also advantageous that the switchable bypass is a CMOS switch provided with a control input, the control input being connected to the voltage source via the first or second supply terminal depending on the control polarity of the CMOS switch. Through the use of the CMOS switch, a consumption of DC power is avoided in the loopthrough mode with the amplifier deactivated, in contrast to the situation with the diode bridge.

In this case, the CMOS switch is preferably formed on a GaAs basis, which is particularly suitable for high-frequency signals.

The signal is advantageously a radio frequency signal. In this case, the frequency range extends from 10 kHz to 100 GHz.

The circuit arrangement advantageously has at least one capacitance between signal input and amplifier input and at least one capacitance between amplifier output and signal output. The capacitances serve as coupling capacitors at the signal input and signal output in order to keep away possible offset DC voltages from objects connected to the circuit arrangement.

It proves to be particularly advantageous if the switching element is a pole changer. The polarity reversal of the voltage supply can thus be realized in a particularly simple manner.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
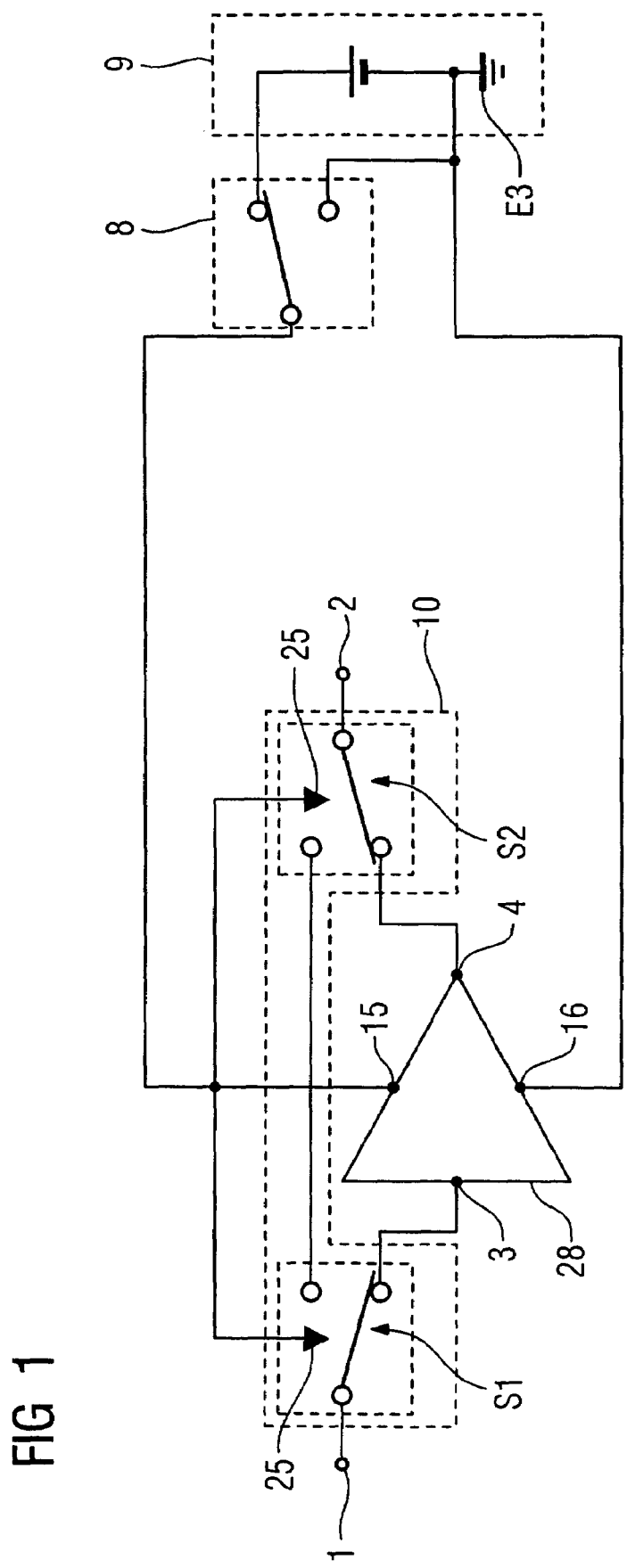
FIG. 1 shows a known standard configuration of a switchable amplifier that can be looped in as needed.

Reference will now be made in detail to the preferred embodiments of the present invention, examples of which are illustrated in the accompanying drawings, wherein like reference numerals refer to like elements throughout.

Mutually corresponding parts are provided with the same reference symbols in FIGS. 1 to 4.

Figure 2:
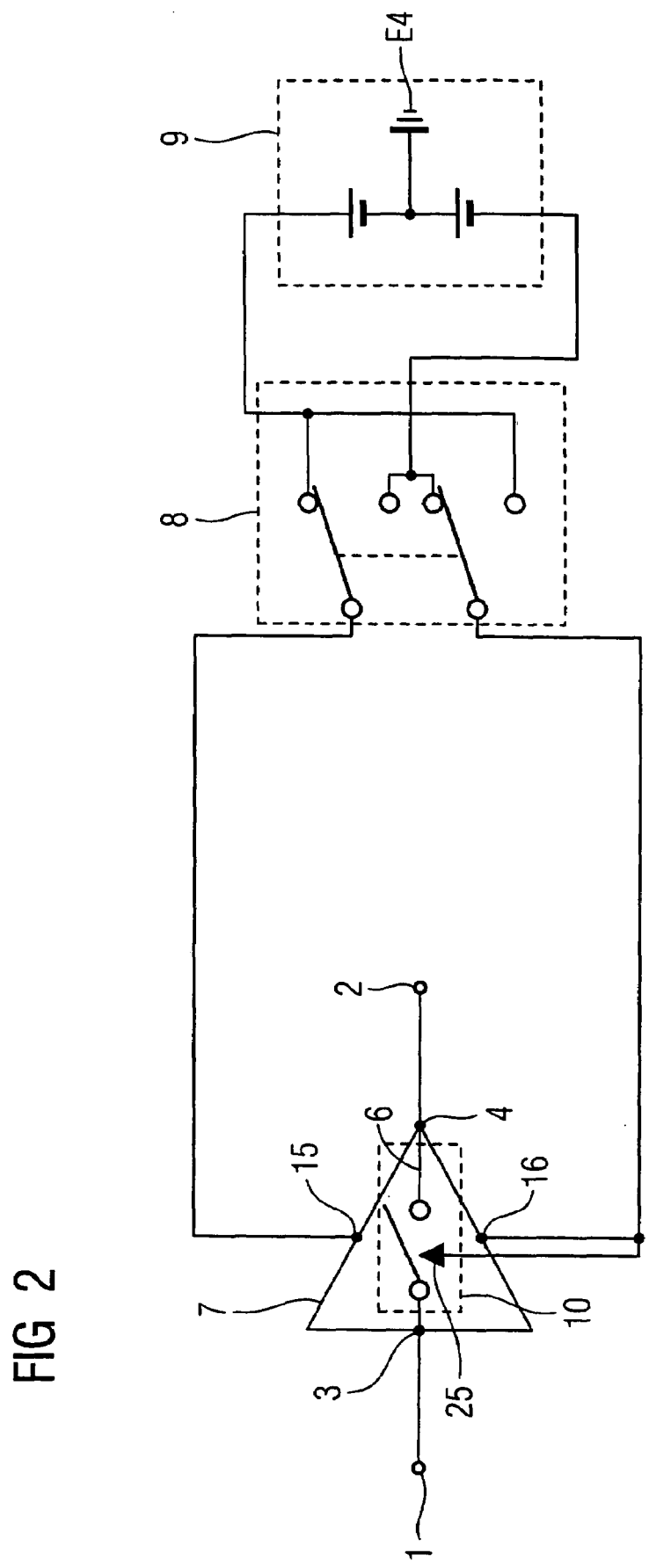
FIG. 2 shows the basic representation of the circuit arrangement according to one embodiment of the invention with a switchable amplifier and a switchable bypass in the negative feedback path between amplifier input and output.

FIG. 2 schematically represents a circuit arrangement having a switchable amplifier 7 arranged between a signal input 1 and a signal output 2 with just a simple on/off switch in the form of a switchable bypass 10 in the negative feedback path between amplifier input 3 and output 4. In this case, the amplifier 7 is connected to a voltage source 9 via two supply terminals 15 and 16, which voltage source, in this example, supplies a positive and a negative voltage of +5 V and −5 V. The polarity of the voltage present at the amplifier 7 is determined by the switching element 8 in this case. As represented, the switching element 8 is a pole changer comprising two switches that are coupled to one another. In the case of the represented switch position of the switching element 8, a positive supply voltage of +5 V, for example, is present at the supply terminal 15 and a negative supply voltage of −5 V, for example, is present at the supply terminal 16. The amplifier 7 is thus activated in this example. In the case of this polarity, a positive voltage is present at the control input 25 of the switchable bypass 10 and results in an open bypass 10 in this example. In the case of the opposite polarity, the bypass 10 is closed and the amplifier 7 is at the same time deactivated, so that the signals fed in at the signal input 1 are as far as possible not influenced. Since the switchable bypass 10 is situated in the negative feedback path 6 of the amplifier 7, the residual capacitance thereof brings about only a small gain reduction toward high frequency. An oscillation does not occur in this case.

Figure 3:
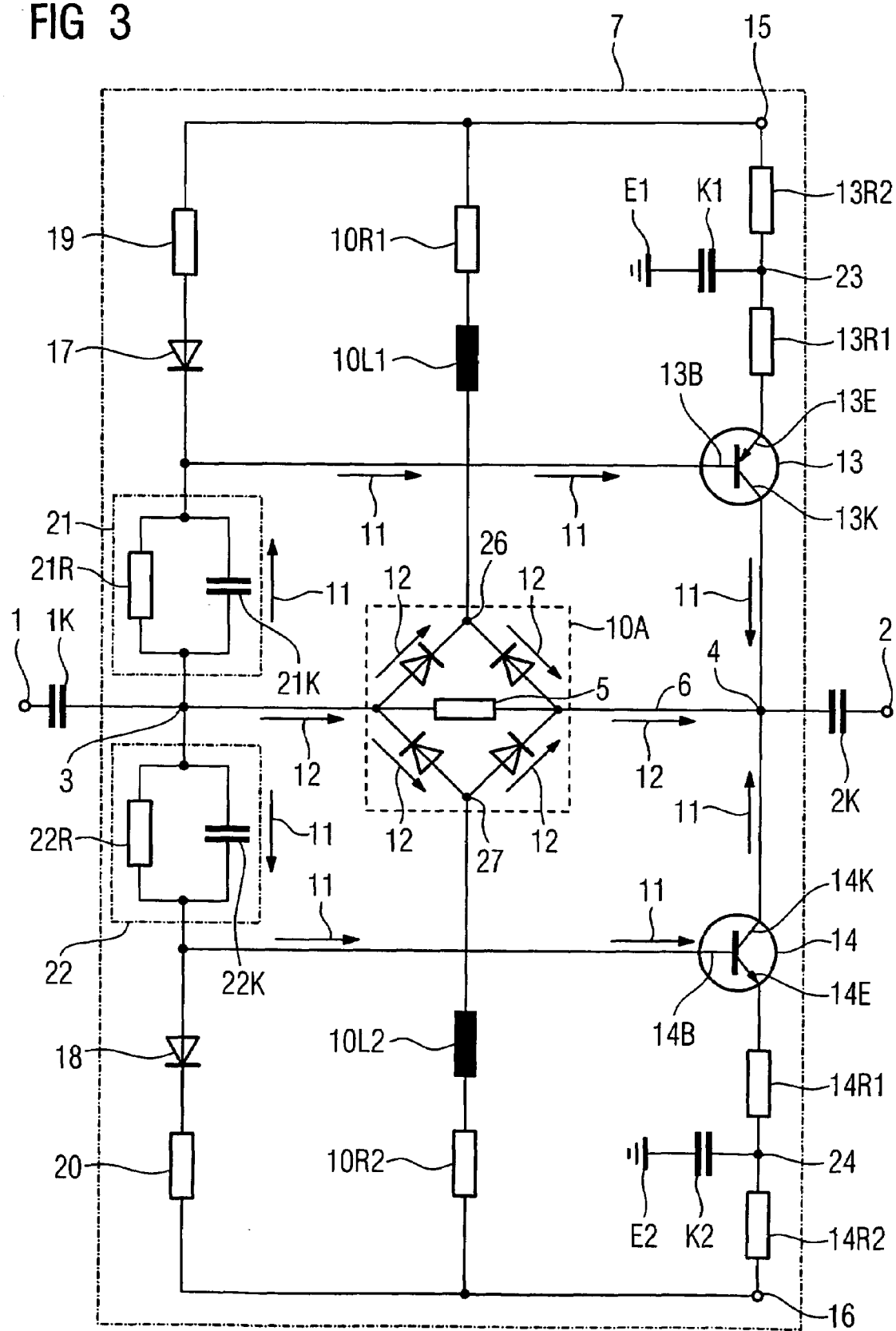
FIG. 3 shows an exemplary embodiment of the circuit arrangement according to one embodiment of the invention with a switchable amplifier and a diode bridge between amplifier input and output.

FIG. 3 shows the circuit diagram of an exemplary embodiment of the amplifier 7 with switchable bypass 10 of the circuit arrangement according to the invention. What is involved in this case is an amplifier 7 with resistive negative feedback that comprises two transistors 13 and 14. In this case, the two collectors 13K and 14K of the two transistors 13 and 14 are jointly connected to the amplifier output 4, while the two emitters 13E and 14E of the two transistors 13 and 14 are connected to the corresponding supply terminals 15 and 16 via in each case at least two resistors 13R1, 13R2 and 14R1 and 14R2. In this case, a node 23 and 24 is in each case provided between the at least two resistors 13R1, 13R2 and 14R1, 14R2, respectively, which node is connected to a respective reference potential E1 and E2, in particular the ground potential, in each case via a capacitance K1 and K2, respectively. In order to ensure a high modulation range, the two transistors 13 and 14 are embodied in complementary fashion. In this case, the first transistor 13 is a pnp transistor and the second transistor 14 is an npn transistor.

The base 13B of the first transistor 13 is connected to the first supply terminal 15 via at least one first diode 17 and at least one resistor 19. Analogously, the base 14B of the second transistor 14 is connected to the second supply terminal 16 via at least one second diode 18 and at least one resistor 20. In this case, the at least one first diode 17 is connected by its cathode to the base 13B of the first transistor 13 and the at least one second diode 18 is connected by its anode to the base 14B of the second transistor 14. Furthermore, the two bases 13B and 14B are jointly connected to the amplifier input 3 via a respective parallel circuit 21 and 22 comprising at least one capacitance 21K and 22K, respectively, and at least one resistor 21R and 22R, respectively. In this case, the quiescent current for the transistors 13 and 14 is defined by the resistors 19, 20, 21R, 22R, 13R1, 13R2, 14R1 and 14R2 and the diodes 17 and 18. Moreover, the diodes 17 and 18 also improve the thermal stability of the amplifier 7 in the activated state. The resistor 5 arranged in the negative feedback path 6 has no DC current in the case of well-matched pnp and npn transistors 13 and 14 and the potential at its two ends is 0 V. Nevertheless, at least one capacitance 1K and 2K is in each case provided between the signal input 1 and amplifier input 3 and between amplifier output 4 and signal output 2 in order to keep away low possible DC offset voltages from objects connected to the circuit arrangement according to the invention.

The negative feedback resistor 5 and the two resistors 13R1 and 14R1 are crucial for the gain. They may be chosen such that a specific predetermined gain is achieved and, moreover, a load of 50 Ω, for example, connected to the signal output 2 is mapped onto the signal input 1 with the same magnitude. The term characteristic impedance principle is used in this context. This is essential particularly for high frequencies. It is furthermore conceivable to embody the resistors 5, 13R1 together with 13R2 and 14R1 together with 14R2 as trimming resistors in order to enable the gain to be changed as required.

In the case where a voltage of +5 V, for example, is present at the supply terminal 15 and a voltage of −5 V, for example, is present at the supply terminal 16, the amplifier 7 is activated in this exemplary embodiment. A diode bridge 10A connected in parallel with the resistor 5 in the negative feedback path 6, which diode bridge is likewise correspondingly connected to the supply terminals 15 and 16 via two terminals 26 and 27, is arranged in such a way that it effects blocking in the case of the polarity specified. The configuration of the diode bridge 10A corresponds to a so-called Graetz bridge 10A in this case. A Graetz bridge 10A has four diodes each provided with a cathode and an anode, two diodes in each case being connected in series in two symmetrical branches. In both symmetrically constructed branches, two diodes in each case are arranged here in such a way that the anode of the first diode is connected to the cathode of the second diode. In the present exemplary embodiment, the Graetz bridge 10A is thus arranged between the two terminals 26 and 27 in such a way that the first terminal 26 is connected to two cathodes and the second terminal 27 is connected to two anodes of the Graetz bridge. This corresponds to an open bypass switch 10. Moreover, at least one series resistor 10R1 and 10R2 is respectively arranged between the two terminals 26 and 27 of the diode bridge 10A and the supply terminals 15 and 16. In the case where a voltage of −5 V, for example, is present at the supply terminal 15 and a voltage of +5 V, for example, is present at the supply terminal 16, the diodes 17 and 18 and the base-emitter diodes of the two transistors 13 and 14 are reverse-biased and the diode bridge 10A is forward-biased. What is achieved by the reverse-biasing is that the signals are not loaded via the resistors 19 and 13R1 and the resistors 20 and 14R1 toward ground. Furthermore, the blocking diodes 17 and 18 prevent an inverse operation of the transistors 13 and 14. The activated diode bridge 10A thus loops the signals fed in at the signal input 1 further to the amplifier output 4. Furthermore, at least one inductance 10L1 and 10L2 is respectively arranged between the series resistors 10R1 and 10R2 and the terminals 26 and 27 of the diode bridge 10A. In this case, the inductances 10L1 and 10L2 prevent a loading of the signals via the series resistors 10R1 and 10R2, which limit the diode currents, to ground. Furthermore, choosing a diode bridge 10A made from pin diodes is advantageous for a low insertion loss with the aim of 0 dB in the case of radiofrequency signals.

Thus, the signals fed in at the signal input 1 pass from amplifier input 3 to amplifier output 4 on a first signal path 11 with the amplifier 7 activated or on a second signal path 12 with the amplifier 7 deactivated. At the amplifier input 3, the first signal path 11 is divided into two symmetrical partial paths that join together again at the amplifier output 4. In this case, each partial path comprises the capacitance 21K or 22K of the corresponding parallel circuit 21 or 22 and the corresponding transistors 13 or 14. The second signal path 12 runs between amplifier input 3 and output 4 via the closed bypass switch 10, that is to say via the activated diode bridge 10A in this exemplary embodiment. In this case, owing to the configuration of the diode bridge 10A, the signal path 12 is also divided here downstream of the amplifier input 3 and joins together again upstream of the amplifier output 4.

Figure 4:
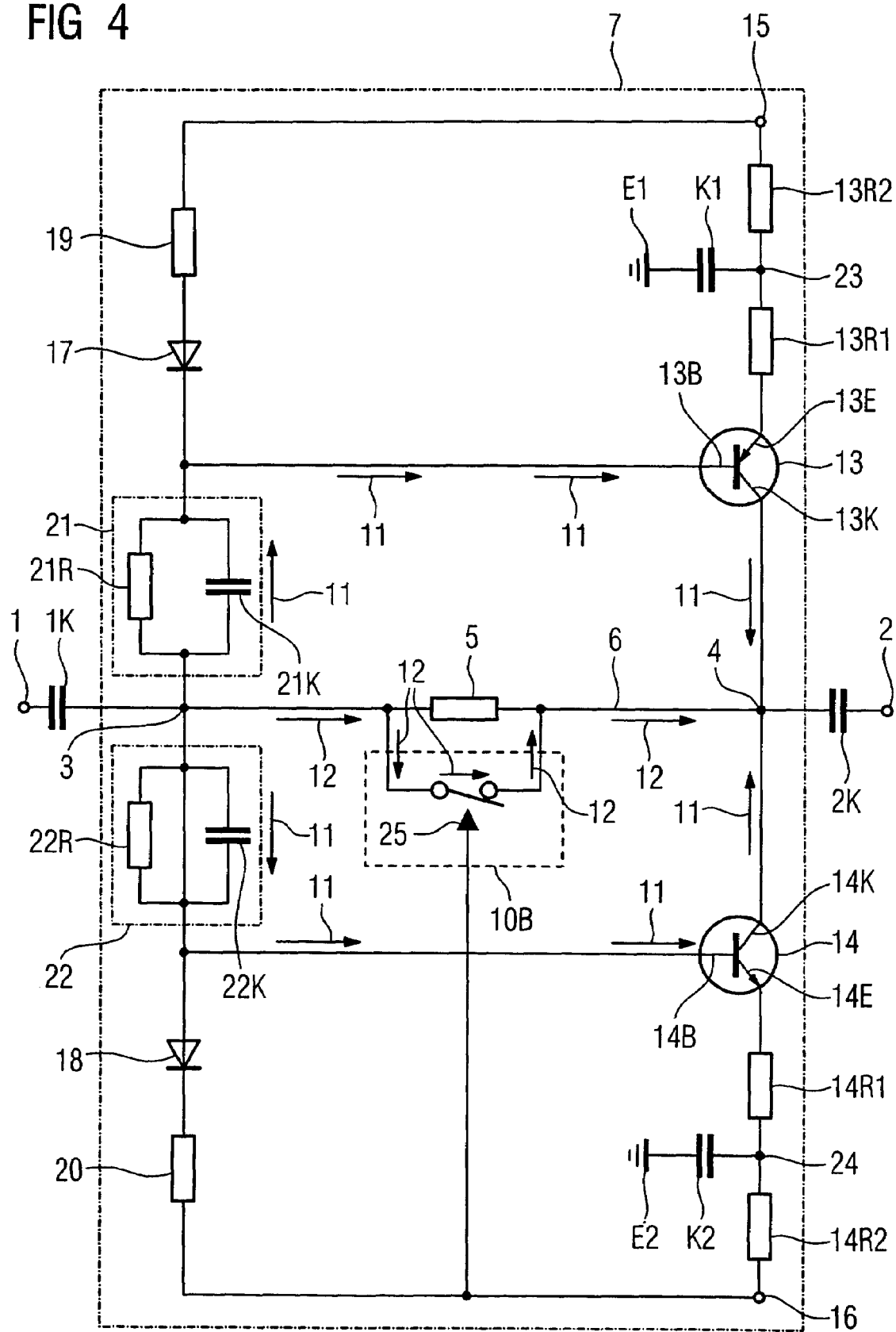
FIG. 4 shows a further exemplary embodiment of the circuit arrangement according to one embodiment of the invention with a switchable amplifier and a CMOS switch between amplifier input and output.

In the case of the embodiment of the circuit arrangement according to the invention as shown in FIG. 3, it is to be assumed that DC power is consumed in the loopthrough mode with the amplifier 7 deactivated, owing to the required energization of the diode bridge 10A. FIG. 4 represents the circuit diagram of a further embodiment of the amplifier 7 with switchable bypass 10 of the circuit arrangement according to the invention, which avoids this problem. Here, instead of the diode bridge 10A, a customary CMOS switch 10B is connected in parallel with the resistor 5. This is because in the case of CMOS switches, as is known, only reverse currents flow in both switch positions. In this exemplary embodiment, the control input 25 of the CMOS switch 10B is in this case connected to the supply terminal 16. The CMOS switch 10B is switched on for example in the case of a positive control voltage, that is to say the bypass switch 10 is closed. In the case of a negative control voltage, however, the CMOS switch 10B is switched off, that is to say the bypass switch 10 is open. If it is desired to use a bypass switch having a different control polarity, then it is accordingly necessary for the control input 25 not to be connected to supply terminal 16 but rather to supply terminal 15.

The invention has been described in detail with particular reference to preferred embodiments thereof and examples, but it will be understood that variations and modifications can be effected within the spirit and scope of the invention covered by the claims which may include the phrase "at least one of A, B and C" or a similar phrase as an alternative expression that means one or more of A, B and C may be used, contrary to the holding in *Superguide v. DIRECTV*, 69 USPQ2d 1865 (Fed. Cir. 2004).

What is claimed is:

1. A circuit arrangement for the switchable amplification of variable electrical signals, comprising:
    a signal input and a signal output;
    an amplifier between the signal input and the signal output and which has an amplifier input, an amplifier output, and a negative feedback path having at least one resistor between the amplifier input and the amplifier output; and
    a voltage source the polarity of which is reversible via a switching element,
    wherein the negative feedback path has a switchable bypass connected in parallel with the at least one resistor, and
    wherein signals fed into the amplifier input are fed to the amplifier output in amplified fashion via a first signal path or in unamplified fashion via a second signal path, depending on the polarity of the voltage source.

2. The circuit arrangement as claimed in claim 1, wherein, depending on the polarity of the voltage source, the switchable amplifier is activated and the switchable bypass is deactivated or the switchable amplifier is to be deactivated and the switchable bypass is activated.

3. The circuit arrangement as claimed in claim 1, wherein the switchable amplifier includes a first transistor and a second transistor and each of the transistors has a collector, an emitter and a base,
    wherein the collectors are connected to the amplifier output, and
    wherein the emitter of the first transistor is connected to the voltage source via a first supply terminal and the emitter of the second transistor is connected to the voltage source via a second supply terminal.

4. The circuit arrangement as claimed in claim 3, wherein the first transistor is a pnp transistor and the second transistor is an npn transistor.

5. The circuit arrangement as claimed in claim 3, wherein the base of the first transistor is connected to the first supply terminal via at least one first diode having a cathode and an anode and at least one resistor and the base of the second transistor is connected to the second supply terminal via at least one second diode having a cathode and an anode and at least one resistor, and wherein the cathode of the at least one first diode is connected to the base of the first transistor and the anode of the at least one second diode is connected to the base of the second transistor.

6. The circuit arrangement as claimed in claim 3, wherein the base of the first transistor is connected to the amplifier input via a first parallel circuit having at least one capacitor and at least one resistor and the base of the second transistor is connected to the amplifier input via a second parallel circuit having at least one capacitor and at least one resistor.

7. The circuit arrangement as claimed in claim 3, wherein at least two resistors are arranged between each of the emitters and a supply terminal, and wherein a node is disposed between each of the at least two resistors, the node being connected to a respective reference potential via at least one capacitor.

8. The circuit arrangement as claimed in claim 6, wherein the first signal path arranged between the amplifier input and the amplifier output is subdivided into two symmetrical partial paths, the first partial path including the capacitor of the first parallel circuit and the first transistor, and the second partial path includes the capacitor of the second parallel circuit and the second transistor, and
    wherein the second signal path is between the amplifier input and the amplifier output and has the switchable bypass.

9. The circuit arrangement as claimed in claim 3, wherein the switchable bypass is a diode bridge having four diodes, each diode has an anode and a cathode, a first terminal of the diode bridge is connected to the first supply terminal via at least one first series resistor, and a second terminal of the diode bridge is connected to the second supply terminal via at least one second series resistor.

10. The circuit arrangement as claimed in claim 9, wherein the first terminal is connected to two cathodes of the diode bridge and the second terminal is connected to two anodes of the diode bridge.

11. The circuit arrangement as claimed in claim 9, wherein at least one first inductor is arranged between the first terminal of the diode bridge and the at least one first series resistor and at least one second inductor is arranged between the second terminal of the diode bridge and the at least one second series resistor.

12. The circuit arrangement as claimed in claim 9, wherein the diode bridge is formed of pin diodes.

13. The circuit arrangement as claimed in claim 3, wherein the switchable bypass is a CMOS switch having a control input connected to the voltage source via the first supply terminal or second supply terminal depending on a control polarity of the CMOS switch.

14. The circuit arrangement as claimed in claim 13, wherein the CMOS switch is formed using a GaAs process.

15. The circuit arrangement as claimed in claim 1, wherein the variable electrical signals are radiofrequency signals.

16. The circuit arrangement as claimed in claim 1, comprising at least one capacitor between the signal input and the amplifier input and between the amplifier output and the signal output.

17. The circuit arrangement as claimed in claim 1, wherein the switching element is a pole changer.

18. The circuit arrangement as claimed in claim 2, wherein the switchable amplifier includes a first transistor and a second transistor and each of the transistors has a collector, an emitter and a base,
wherein the collectors are connected to the amplifier output, and
wherein the emitter of the first transistor is connected to the voltage source via a first supply terminal and the emitter of the second transistor is connected to the voltage source via a second supply terminal.

19. The circuit arrangement as claimed in claim 18, wherein the first transistor is a pnp transistor and the second transistor is an npn transistor.

20. The circuit arrangement as claimed in claim 18, wherein the base of the first transistor is connected to the first supply terminal via at least one first diode having a cathode and an anode and at least one resistor and the base of the second transistor is connected to the second supply terminal via at least one second diode having a cathode and an anode and at least one resistor, and wherein the cathode of the at least one first diode is connected to the base of the first transistor and the anode of the at least one second diode is connected to the base of the second transistor.

21. The circuit arrangement as claimed in claim 18, wherein the base of the first transistor is connected to the amplifier input via a first parallel circuit having at least one capacitor and at least one resistor and the base of the second transistor is connected to the amplifier input via a second parallel circuit having at least one capacitor and at least one resistor.

22. The circuit arrangement as claimed in claim 18, wherein at least two resistors are arranged between each of the emitters and a supply terminal, and wherein a node is disposed between each of the at least two resistors, the node being connected to a respective reference potential via at least one capacitor.

23. The circuit arrangement as claimed in claim 21, wherein the first signal path arranged between the amplifier input and the amplifier output is subdivided into two symmetrical partial paths, the first partial path including the capacitor of the first parallel circuit and the first transistor, and the second partial path includes the capacitor of the second parallel circuit and the second transistor, and
wherein the second signal path is between the amplifier input and the amplifier output and has the switchable bypass.

24. The circuit arrangement as claimed in claim 18, wherein the switchable bypass is a diode bridge having four diodes, each diode has an anode and a cathode, a first terminal of the diode bridge is connected to the first supply terminal via at least one first series resistor, and a second terminal of the diode bridge is connected to the second supply terminal via at least one second series resistor.

25. The circuit arrangement as claimed in claim 24, wherein the first terminal is connected to two cathodes of the diode bridge and the second terminal is connected to two anodes of the diode bridge.

26. The circuit arrangement as claimed in claim 24, wherein at least one first inductor is arranged between the first terminal of the diode bridge and the at least one first series resistor and at least one second inductor is arranged between the second terminal of the diode bridge and the at least one second series resistor.

27. The circuit arrangement as claimed in claim 18, wherein the switchable bypass is a CMOS switch having a control input connected to the voltage source via the first supply terminal or second supply terminal depending on a control polarity of the CMOS switch.

28. The circuit arrangement as claimed in claim 2, wherein the variable electrical signals are radiofrequency signals.

29. The circuit arrangement as claimed in claim 2, comprising at least one capacitor between the signal input and the amplifier input and between the amplifier output and the signal output.

30. The circuit arrangement as claimed in claim 2, wherein the switching element is a pole changer.

* * * * *